(12) United States Patent
Hattori

(10) Patent No.: US 12,270,861 B2
(45) Date of Patent: Apr. 8, 2025

(54) ENERGY STORAGE APPARATUS, ENERGY STORAGE SYSTEM, INTERNAL RESISTANCE ESTIMATION METHOD, AND COMPUTER PROGRAM

(71) Applicant: GS Yuasa International Ltd., Kyoto (JP)

(72) Inventor: Shigeki Hattori, Kyoto (JP)

(73) Assignee: GS YUASA International Ltd., Kyoto (JP)

( * ) Notice: Subject to any disclaimer, the term of this patent is extended or adjusted under 35 U.S.C. 154(b) by 95 days.

(21) Appl. No.: 18/019,785

(22) PCT Filed: Jul. 29, 2021

(86) PCT No.: PCT/JP2021/028081
§ 371 (c)(1),
(2) Date: Feb. 3, 2023

(87) PCT Pub. No.: WO2022/030355
PCT Pub. Date: Feb. 10, 2022

(65) Prior Publication Data
US 2023/0288488 A1 Sep. 14, 2023

(30) Foreign Application Priority Data

Aug. 4, 2020 (JP) .................................. 2020-132495

(51) Int. Cl.
*G01R 31/389* (2019.01)
*G01R 31/3842* (2019.01)
*H02J 7/00* (2006.01)

(52) U.S. Cl.
CPC ....... *G01R 31/389* (2019.01); *G01R 31/3842* (2019.01); *H02J 7/007182* (2020.01)

(58) Field of Classification Search
None
See application file for complete search history.

(56) References Cited

U.S. PATENT DOCUMENTS

| | | | |
|---|---|---|---|
| 2006/0113959 A1* | 6/2006 | Honma | G01R 31/389 320/128 |
| 2012/0098501 A1* | 4/2012 | Paryani | H02J 7/0069 320/156 |

(Continued)

FOREIGN PATENT DOCUMENTS

| | | |
|---|---|---|
| JP | 2016117413 | 6/2016 |
| JP | 2017125729 | 7/2017 |

(Continued)

OTHER PUBLICATIONS

"International Search Report (Form PCT/ISA/210) of PCT/JP2021/028081", mailed on Nov. 2, 2021, with English translation thereof, pp. 1-4.

*Primary Examiner* — Jas A Sanghera
(74) *Attorney, Agent, or Firm* — JCIPRNET

(57) ABSTRACT

An energy storage apparatus includes an energy storage device and a management unit. The management unit: lowers an SOC of the energy storage device by discharge of the energy storage device; acquires current and voltage of the energy storage device while the SOC of the energy storage device is within a predetermined SOC range in a process of raising the SOC of the energy storage device by charge of the energy storage device; and calculates an internal resistance of the energy storage device based on the acquired current and voltage. The SOC range is a range in which a change in voltage of the energy storage device with respect to a change in SOC of the energy storage device is larger than a range in which a value of the SOC is larger than the SOC range.

7 Claims, 7 Drawing Sheets

(56) References Cited

U.S. PATENT DOCUMENTS

| | | | |
|---|---|---|---|
| 2013/0127400 A1* | 5/2013 | Oh | B60L 58/20 |
| | | | 320/104 |
| 2013/0229154 A1* | 9/2013 | Benjamin | G01R 31/378 |
| | | | 320/132 |
| 2016/0229302 A1* | 8/2016 | Lee | H02J 7/1423 |
| 2018/0147942 A1 | 5/2018 | Iida et al. | |
| 2018/0267107 A1 | 9/2018 | Iida et al. | |
| 2020/0212517 A1 | 7/2020 | Akao et al. | |
| 2020/0269699 A1 | 8/2020 | Nakanishi et al. | |
| 2020/0281276 A1 | 9/2020 | Akao et al. | |
| 2020/0281277 A1 | 9/2020 | Akao et al. | |

FOREIGN PATENT DOCUMENTS

| | | |
|---|---|---|
| JP | 2018121511 | 8/2018 |
| JP | 2020103130 | 7/2020 |
| JP | 2020176899 | 10/2020 |
| WO | 2016129260 | 8/2016 |
| WO | 2016194271 | 12/2016 |
| WO | 2019077708 | 4/2019 |
| WO | 2019077709 | 4/2019 |

* cited by examiner

# ENERGY STORAGE APPARATUS, ENERGY STORAGE SYSTEM, INTERNAL RESISTANCE ESTIMATION METHOD, AND COMPUTER PROGRAM

CROSS-REFERENCE TO RELATED APPLICATION

This application is a 371 application of the international PCT application serial no. PCT/JP2021/028081, filed on Jul. 29, 2021, which claims the priority benefit of Japan application no. 2020-132495, filed on Aug. 4, 2020. The entirety of each of the above-mentioned patent applications is hereby incorporated by reference herein and made a part of this specification.

TECHNICAL FIELD

The present invention relates to an energy storage apparatus, an energy storage system, an internal resistance estimation method, and a computer program that perform processing for estimating internal resistance.

BACKGROUND ART

An energy storage apparatus such as a lead-acid battery or a lithium ion secondary battery is mounted on a vehicle. Because a degradation state of the energy storage apparatus affects operation of the vehicle, the energy storage apparatus desirably determines the degradation state as needed. The internal resistance of the energy storage apparatus is required to be estimate in order to determine the degradation state of the energy storage apparatus. When starting an engine, the vehicle performs cranking to rotate a crankshaft of the engine using an electric motor outside the engine. During the cranking, the energy storage apparatus performs discharge to supply power to the electric motor, and a large current flows through the energy storage apparatus. Patent Document 1 discloses a technique for estimating the internal resistance of the energy storage apparatus using the large current flowing during the cranking.

PRIOR ART DOCUMENT

Patent Document

Patent Document 1: JP-A-2016-117413

SUMMARY OF THE INVENTION

Problems to be Solved by the Invention

Some energy storage apparatuses provided in the vehicle are not used for driving the vehicle or starting the engine, but are used for supplying the power to electric equipment in the vehicle. In such the energy storage apparatus, the large current does not flow during the cranking, the current flowing due to the discharge is small, and a voltage fluctuation is also small. As a result, the influence of the measurement errors of the current and the voltage on the estimation result of the internal resistance increases, and accuracy of the estimation of the internal resistance is low. For this reason, a technique for improving the accuracy of the estimation of the internal resistance in the energy storage apparatus is desired.

An object of the present invention is to provide an energy storage apparatus, an energy storage system, an internal resistance estimation method, and a computer program capable of estimating the internal resistance with high accuracy even when there is no opportunity for the large current to flow due to the discharge.

Means for Solving the Problems

An energy storage apparatus according to one aspect of the present invention includes an energy storage device and a management unit. The management unit: lowers a state of charge (SOC) of the energy storage device by discharge of the energy storage device; acquires current and voltage of the energy storage device while the SOC of the energy storage device is within a predetermined SOC range in a process of raising the SOC of the energy storage device by charge of the energy storage device; and calculates an internal resistance of the energy storage device based on the acquired current and voltage. The SOC range is a range in which a change in voltage of the energy storage device with respect to a change in SOC of the energy storage device is larger than a range in which a value of the SOC is larger than the SOC range.

An energy storage system according to one aspect of the present invention includes a first energy storage apparatus, a second energy storage apparatus that supplies power to a second load different from a first load to which the first energy storage apparatus supplies power, and a power transmission circuit that supplies power from the first energy storage apparatus to the second energy storage apparatus. The second energy storage apparatus includes an energy storage device and a management unit. The management unit: lowers an SOC of the energy storage device by discharge of the energy storage device; supplies power from the first energy storage apparatus to the second energy storage apparatus through the power transmission circuit; acquires current and voltage of the energy storage device while the SOC of the energy storage device is within a predetermined SOC range in a process of raising the SOC of the energy storage device by charge of the energy storage device; and calculates an internal resistance of the energy storage device based on the acquired current and voltage. The SOC range is a range in which a change in voltage of the energy storage device with respect to a change in SOC of the energy storage device is larger than a range in which a value of the SOC is larger than the SOC range.

In a method for estimating an internal resistance of an energy storage device according to one aspect of the present invention, lowering an SOC of the energy storage device by discharge of the energy storage device, acquiring current and voltage of the energy storage device while the SOC of the energy storage device is within a predetermined SOC range in a process of raising the SOC of the energy storage device by charge of the energy storage device, and calculating the internal resistance of the energy storage device based on the acquired current and voltage. The SOC range is a range in which a change in voltage of the energy storage device with respect to a change in SOC of the energy storage device is larger than a range in which a value of the SOC is larger than the SOC range.

A computer program according to one aspect of the present invention causes a computer to execute: lowering an SOC of an energy storage device by discharge of the energy storage device; acquiring current and voltage of the energy storage device while the SOC of the energy storage device is included in a predetermined SOC range in which a change in voltage of the energy storage device with respect to a change in the SOC of the energy storage device is larger than other ranges in a process of raising the SOC of the energy storage device by charge of the energy storage device; and calculating an internal resistance of the energy storage device based on the acquired current and voltage.

Advantages of the Invention

With the above-mentioned configuration, the energy storage apparatus can estimate the internal resistance of the energy storage device with high accuracy even when there is no opportunity that the large current flows due to the discharge.

MODE FOR CARRYING OUT THE INVENTION

Figure 1:
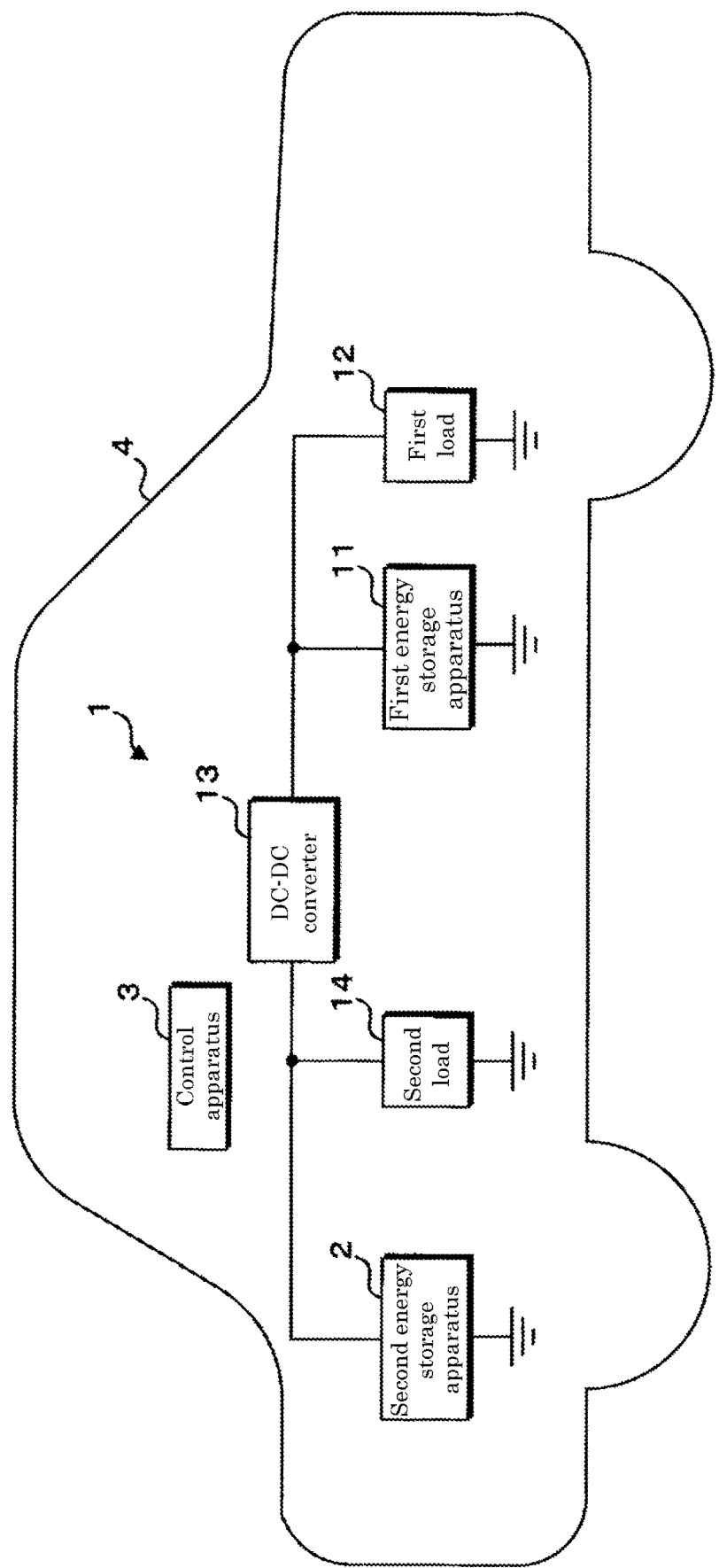
FIG. 1 is a block diagram illustrating a configuration example of an energy storage system.

An energy storage apparatus includes an energy storage device and a management unit. The management unit: lowers a state of charge (SOC) of the energy storage device by discharge of the energy storage device; acquires current and voltage of the energy storage device while the SOC of the energy storage device is within a predetermined SOC range in a process of raising the SOC of the energy storage device by charge of the energy storage device; and calculates an internal resistance of the energy storage device based on the acquired current and voltage. The SOC range is a range in which a change in voltage of the energy storage device with respect to a change in SOC of the energy storage device is larger than a range in which a value of the SOC is larger than the SOC range.

The energy storage apparatus performs discharge to lower the SOC of the energy storage device, then performs the charge to raise the SOC of the energy storage device, and acquires the current and the voltage of the energy storage device while the SOC is raised within a predetermined SOC range. Furthermore, the energy storage apparatus estimates the internal resistance by calculating the internal resistance of the energy storage device based on the acquired current and voltage. In the predetermined SOC range, the change in voltage with respect to the change in SOC is larger than that of the range where the SOC value is larger. For this reason, the accuracy of estimating the internal resistance becomes high when the change in the value of the voltage acquired during the charge is large and when the internal resistance is calculated using the acquired current and voltage. Because the internal resistance is calculated after the SOC is adjusted such that the change in the voltage value becomes large, the accuracy of estimating the internal resistance is always high, and the internal resistance of the energy storage device can be stably estimated with high accuracy. In addition, because the energy storage apparatus performs the charge after once lowering the SOC of the energy storage device, there is a low possibility that overcharge is generated in the energy storage device even when the large current flows. Thus, the large current can flow through the energy storage device. When the large current flows, a temporal change of the measured voltage increases. The accuracy of estimating the internal resistance is improved by calculating the internal resistance from the voltage value having the large temporal change.

The management unit may lower the SOC of the energy storage device to less than a lower limit value of the SOC included in the SOC range during discharge, and raise the SOC of the energy storage device to a value exceeding at least the lower limit value during charge. The energy storage apparatus once lowers the SOC of the energy storage device to less than the lower limit value of the predetermined SOC range, and then charges the energy storage device until the SOC exceeds at least the lower limit value of the SOC range. During the charge, the SOC is included in the predetermined SOC range. By acquiring the current and the voltage of the energy storage device while the charge is performed in the state where the SOC is included in the predetermined SOC range, the current and the voltage can be easily acquired while the change in the value of the voltage becomes large.

The management unit may receive state information indicating a state outside the energy storage apparatus, and determine whether to start processing for lowering the SOC of the energy storage device according to the state information. Depending on a state outside the energy storage apparatus such as the case where power demand is large in the energy storage system including the energy storage apparatus, there is a possibility that power to be supplied becomes insufficient by lowering the SOC of the energy storage device. The SOC of the energy storage device is lowered when the shortage of the power is not generated according to the external state of the energy storage apparatus, whereby the shortage of the power is prevented from being generated.

The management unit may discharge the energy storage device by supplying power from the energy storage device to a load outside the energy storage apparatus. Because the load to which the power is supplied is outside the energy storage apparatus, the configuration is easily performed so as to efficiently consume the power by increasing power consumption. By supplying the power to the load that efficiently consumes the power, the power of the energy storage device is efficiently consumed, and the discharge is reliably performed.

The energy storage apparatus may further include a load circuit. The management unit may discharge the energy storage device by supplying the power from the energy storage device to the load circuit. In any state of the outside of the energy storage apparatus such as a state where the energy storage apparatus is not connected to an external load, the energy storage apparatus can discharge the energy storage device by itself by supplying the power to the internal load circuit.

The energy storage apparatus may be an apparatus that is provided in an electric vehicle and supplies power to a 12-V load of the electric vehicle. In the energy storage apparatus, the large current does not flow due to the discharge when the vehicle is driven or started. However, by performing the charge under the condition that the change in the value of the voltage becomes large, the internal resistance of the energy storage device can be estimated with high accuracy even in the energy storage apparatus in which there is no chance that the large current flows due to the discharge.

An energy storage system includes a first energy storage apparatus, a second energy storage apparatus that supplies power to a second load different from a first load to which the first energy storage apparatus supplies power, and a power transmission circuit that supplies power from the first energy storage apparatus to the second energy storage apparatus. The second energy storage apparatus includes an energy storage device and a management unit. The management unit: lowers an SOC of the energy storage device by discharge of the energy storage device; supplies power from the first energy storage apparatus to the second energy storage apparatus through the power transmission circuit; acquires current and voltage of the energy storage device while the SOC of the energy storage device is within a predetermined SOC range in a process of raising the SOC of the energy storage device by charge of the energy storage device; and calculates an internal resistance of the energy storage device based on the acquired current and voltage. The SOC range is a range in which a change in voltage of the energy storage device with respect to a change in SOC of the energy storage device is larger than a range in which a value of the SOC is larger than the SOC range. The second energy storage apparatus temporarily lowers the SOC of the energy storage device by discharge, and raises the SOC of the energy storage device by the charge by supplying power from the first energy storage apparatus. In the process of raising the SOC, the internal resistance of the energy storage device is estimated based on the current and the voltage measured within a predetermined SOC range where the change in voltage with respect to the change in SOC is large. The second energy storage apparatus can estimate the internal resistance of the energy storage device by the charge using the power from the first energy storage apparatus without performing the discharge flowing the large current. In the second energy storage apparatus, because the internal resistance is calculated after the SOC is adjusted such that the change in voltage according to the change in the SOC due to charge becomes large, the accuracy of estimating the internal resistance becomes high, and the internal resistance can be stably estimated with high accuracy.

The energy storage system may further include a control apparatus. The second load may be connected to the second energy storage apparatus, the first energy storage apparatus may be connected to the second load or the second energy storage apparatus through the power transmission circuit, the control apparatus may input state information indicating whether a state of the first energy storage apparatus and/or the power transmission circuit is a state in which power can be supplied from the first energy storage apparatus to the second load or the second energy storage apparatus to the management unit, and the management unit may determine whether to start processing for lowering an SOC of the energy storage device according to the state information. When the defect exists in the first energy storage apparatus or the power transmission circuit, it is difficult to charge the second energy storage apparatus with power from the first energy storage apparatus or to supply power from the first energy storage apparatus to the second load. By lowering the SOC of the energy storage device in the good state of the first energy storage apparatus or the power transmission circuit, the second energy storage apparatus can be prevented from being incapable of being charged or the power supplied to the second load from being insufficient.

The energy storage system may be provided in the vehicle. The control apparatus may input information indicating whether the vehicle is parked to the management unit as the state information. In the state other than the parked state, the demand for power in the vehicle is large, and there is a possibility that the power to be supplied becomes insufficient when the SOC of the energy storage device is lowered by the second energy storage apparatus. By lowering the SOC of the energy storage device during parking, generation of shortage of the power is prevented.

The energy storage system may be provided in a vehicle, the first load may include electric equipment used to drive or start the vehicle, the second load may not include any electric equipment used to drive or start the vehicle, and the second energy storage apparatus may not supply power to the first load. The first energy storage apparatus is used for driving or starting the vehicle, and a large current flows by discharge. On the other hand, in the second energy storage apparatus, the large current does not flow due to the discharge when the vehicle is driven or started. However, because the second energy storage apparatus is charged using the power from the first energy storage apparatus under the condition that the change in the value of the voltage becomes large, the internal resistance of the energy storage device can be estimated with high accuracy even when there is no opportunity that the large current flows due to the discharge.

In a method for estimating an internal resistance of an energy storage device, lowering an SOC of the energy storage device by discharge of the energy storage device, acquiring current and voltage of the energy storage device while the SOC of the energy storage device is within a predetermined SOC range in a process of raising the SOC of the energy storage device by charge of the energy storage device, and calculating the internal resistance of the energy storage device based on the acquired current and voltage. The SOC range is a range in which a change in voltage of the energy storage device with respect to a change in SOC of the energy storage device is larger than a range in which a value of the SOC is larger than the SOC range. The SOC of the energy storage device is temporarily lowered by the discharge, the SOC of the energy storage device is raised by the charge, and the internal resistance of the energy storage device is estimated based on the current and the voltage measured within a predetermined SOC range where the change in voltage with respect to the change in SOC is large. The accuracy of estimating the internal resistance becomes high when the change in the value of the voltage acquired during the charge is large and when the internal resistance is calculated using the acquired current and voltage. Because the internal resistance is calculated after the SOC is adjusted such that the change in the voltage value becomes large, the internal resistance can be stably estimated with high accuracy.

A computer program causing a computer to execute processing for estimating an internal resistance of an energy storage device, the computer program causing the computer to execute: lowering an SOC of the energy storage device by discharge of the energy storage device; acquiring current and voltage of the energy storage device while the SOC of the energy storage device is included in a predetermined SOC range in which a change in voltage of the energy storage device with respect to a change in the SOC of the energy storage device is larger than other ranges in a process of raising the SOC of the energy storage device by charge of the energy storage device; and calculating the internal resistance of the energy storage device based on the acquired current and voltage. The computer temporarily lowers the SOC of the energy storage device by the discharge, raises the SOC of the energy storage device by the charge, and estimates the internal resistance of the energy storage device based on the current and the voltage measured within a predetermined SOC range in which a change in voltage with respect to a change in the SOC is large. The accuracy of estimating the internal resistance becomes high when the change in the value of the voltage acquired during the charge is large and when the internal resistance is calculated using the acquired current and voltage. Because the internal resistance is calculated after the SOC is adjusted such that the change in the voltage value becomes large, the computer can estimate the internal resistance of the energy storage device with high accuracy.

Hereinafter, the present invention will be specifically described based on the drawings illustrating an embodiment.

Embodiment

FIG. 1 is a block diagram illustrating a configuration example of an energy storage system 1. The energy storage system 1 is provided in a vehicle 4. The energy storage system 1 executes an internal resistance estimation method. The energy storage system 1 includes a first energy storage apparatus 11, a DC-DC converter 13, a second energy storage apparatus 2, and a control apparatus 3. For example, the first energy storage apparatus 11 is a 48-V power supply, and the second energy storage apparatus 2 is a 12-V power supply. The first energy storage apparatus 11 is connected to a first load 12 and supplies power to the first load 12. The first load 12 includes the electric equipment used for driving or starting the vehicle 4, such as an electric motor. The driving of the vehicle 4 means traveling of the vehicle 4 by operation of the engine or traveling of the vehicle 4 by operation of the electric motor. The starting of the vehicle 4 means a start of the operation of the engine that causes the vehicle 4 to travel. When the power is supplied from the first energy storage apparatus 11 to the first load, the vehicle 4 is driven and started. That is, when the vehicle 4 is driven or started, the first energy storage apparatus 11 is discharged, and the large current flows through the first energy storage apparatus 11. For example, when the vehicle 4 is started, the cranking is performed, and the large current flows through the first energy storage apparatus 11. In the first energy storage apparatus 11, the internal resistance can be estimated during the cranking. The power is supplied from an alternator (not illustrated) or the outside of the vehicle 4 to the first energy storage apparatus 11, and the first energy storage apparatus 11 performs the charge. The vehicle 4 may be an electric vehicle that travels by the operation of the electric motor, such as an electric vehicle (EV, Electric Vehicle), a hybrid electric vehicle (HEV, Hybrid Electric Vehicle), or a plug-in hybrid electric vehicle (PHEV, plug-in hybrid electric vehicle). For example, the energy storage system 1 in FIG. 1 may be a power supply system of the PHEV.

The second energy storage apparatus 2 is connected to a second load 14 and supplies the power to the second load 14. The second load 14 is the electric equipment different from the first load 12. The second load 14 does not include any the electric equipment used for driving or starting the vehicle 4. The second load 14 is the electric equipment that consumes less power than the first load 12, such as a lamp or an air conditioner. For example, the second load 14 is a 12-V load. The second energy storage apparatus 2 does not supply the power to the first load 12. The second energy storage apparatus 2 is not used for either driving or starting the vehicle 4, and the large current does not flow due to the discharge for driving or starting the vehicle 4. For example, in the second energy storage apparatus 2, the large current does not flow during the cranking. Therefore, there is no opportunity for the large current to flow through the second energy storage apparatus 2 due to the discharge. For example, the first energy storage apparatus 11 has a higher voltage than the second energy storage apparatus 2. For example, the second energy storage apparatus 2 is what is called an auxiliary battery.

The DC-DC converter 13 is connected to the first energy storage apparatus 11 and the second energy storage apparatus 2. The first energy storage apparatus 11 is connected to the second energy storage apparatus 2 and the second load 14 with the DC-DC converter 13 interposed therebetween. The DC-DC converter 13 converts the voltage of the first energy storage apparatus 11 and supplies the power from the first energy storage apparatus 11 to the second energy storage apparatus 2 and the second load 14. The DC-DC converter 13 corresponds to the power transmission circuit. The first energy storage apparatus 11 can supply the power to the second load 14 through the DC-DC converter 13. In addition, the first energy storage apparatus 11 supplies the power to the second energy storage apparatus 2 through the DC-DC converter 13 to charge the second energy storage apparatus 2.

The control apparatus 3 is connected to each unit of the energy storage system 1 and controls each unit. For example, the control apparatus 3 is configured using an engine control unit (ECU). The control apparatus 3 may control the first load 12 or the second load 14. The control apparatus 3 may receive a signal from the outside of the energy storage system 1. For example, the control apparatus 3 may receive signals from various sensors provided in the vehicle 4.

Figure 2:
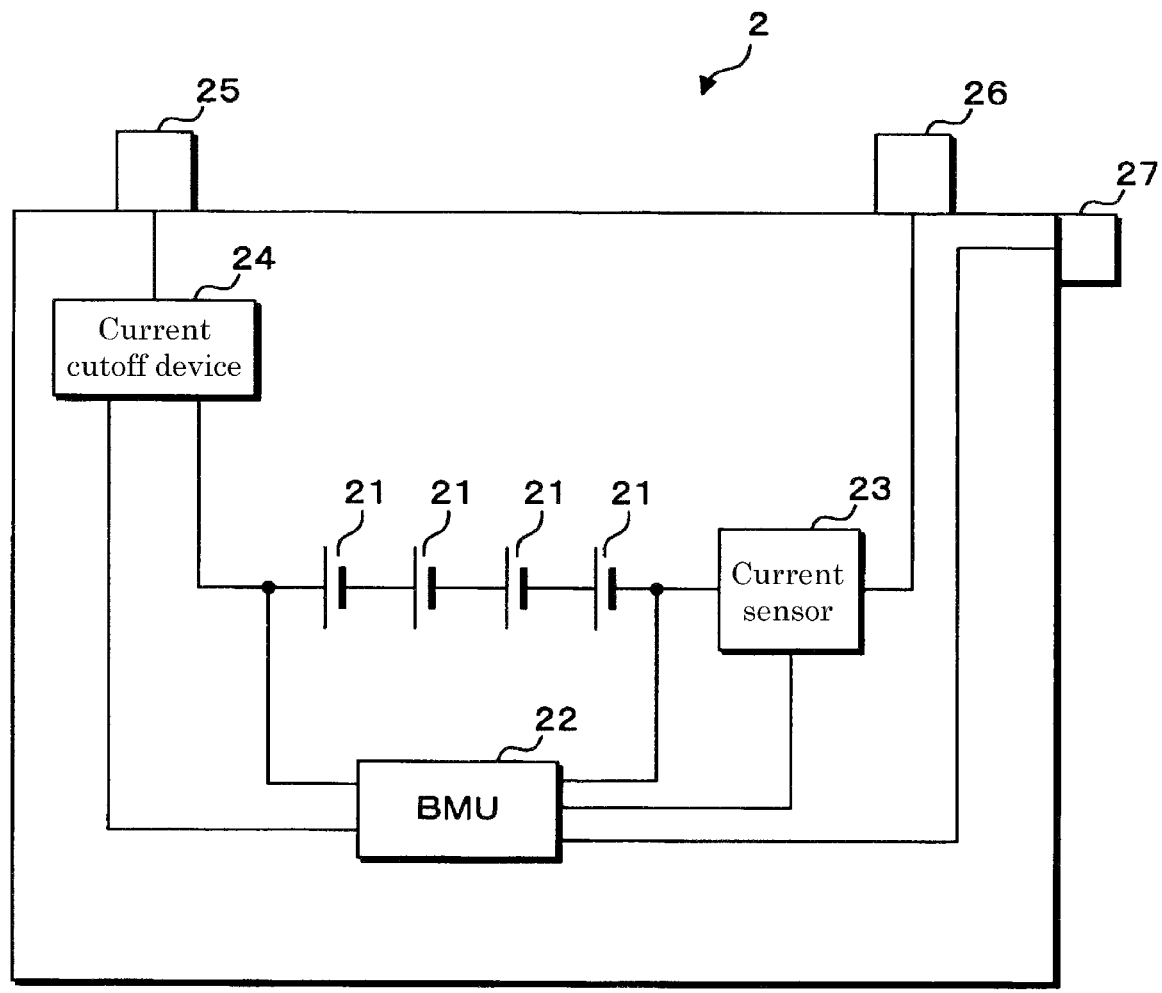
FIG. 2 is a block diagram illustrating a configuration example of a second energy storage apparatus.

FIG. 2 is a block diagram illustrating a configuration example of the second energy storage apparatus 2. The second energy storage apparatus 2 includes a plurality of energy storage cells 21. The plurality of energy storage cells 21 are connected in series. The plurality of energy storage cells 21 correspond to the energy storage device. For example, the energy storage cell 21 is a lithium ion secondary battery. The energy storage cell 21 may be another secondary battery such as a lead-acid battery.

One end of the plurality of energy storage cells 21 connected in series is connected to a positive electrode terminal 25 through a power line, and the other end is connected to a negative electrode terminal 26 through the power line. The positive electrode terminal 25 and the negative electrode terminal 26 are connected to the outside of the second energy storage apparatus 2 through the power line. For example, one of the positive electrode terminal 25 and the negative electrode terminal 26 is connected to the second load 14 and the DC-DC converter 13, and the other is connected to the ground. The current flows through the plurality of energy storage cells 21 through the positive electrode terminal 25 and the negative electrode terminal 26, and the plurality of energy storage cells 21 perform the discharge or the charge. When the plurality of energy storage cells 21 are discharged, the power is supplied to the second load 14 through the positive electrode terminal 25 and the negative electrode terminal 26. When the power is supplied from the outside of the second energy storage apparatus 2 to the second energy storage apparatus 2 through the positive electrode terminal 25 and the negative electrode terminal 26, the plurality of energy storage cells 21 perform the charge.

A current sensor 23 and a current cutoff device 24 are provided in the middle of an electric path between the plurality of energy storage cells 21 and the positive electrode terminal 25 or the negative electrode terminal 26. The current sensor 23 measures currents flowing through the plurality of energy storage cells 21. The current cutoff device 24 cuts off the currents flowing through the plurality of energy storage cells 21 to stop the discharge or the charge. The energy storage apparatus 2 includes a battery management unit (BMU) 22. The BMU 22 corresponds to the management unit. The BMU 22 is connected to both ends of the plurality of energy storage cells 21, and is connected to the current sensor 23 and the current cutoff device 24 through a communication line. Both ends of the plurality of energy storage cells 21 are both ends of one energy storage device when the plurality of energy storage cells 21 connected in series are integrated into one energy storage device. The BMU 22 controls the current sensor 23 and the current cutoff device 24. The second energy storage apparatus 2 includes a communication connector 27 connected to equipment outside the second energy storage apparatus 2 through the communication line. For example, the communication connector 27 is connected to the control apparatus 3. The BMU 22 is connected to the communication connector 27 by the communication line.

Figure 3:
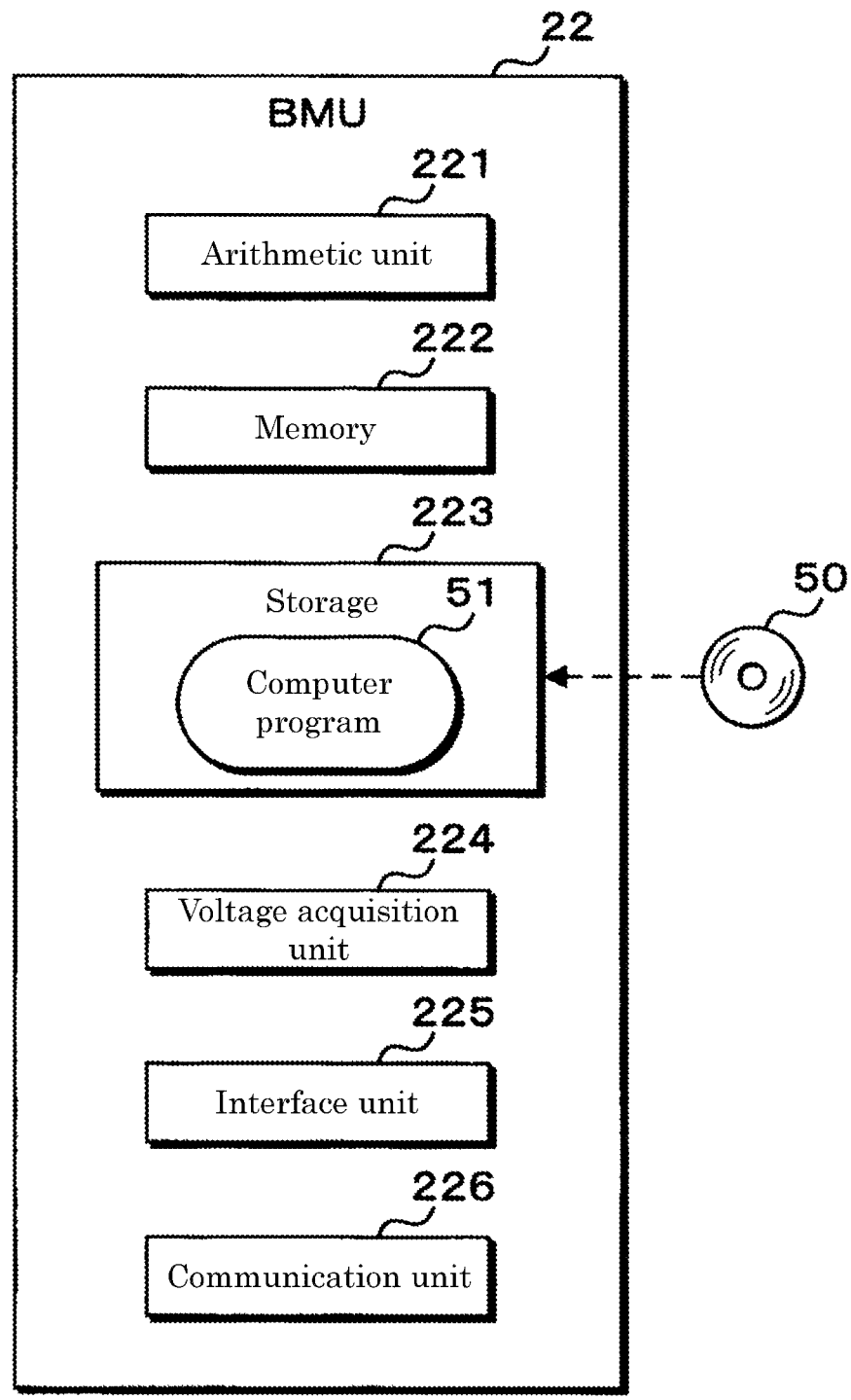
FIG. 3 is a block diagram illustrating a functional configuration example of an inside of a BMU.

FIG. 3 is a block diagram illustrating a functional configuration example of an inside of the BMU 22. The BMU 22 manages states of the plurality of energy storage cells 21 and controls each unit of the second energy storage apparatus 2. The BMU 22 includes an arithmetic unit 221, a memory 222, a storage 223, a voltage acquisition unit 224, an interface unit 225, and a communication unit 226. For example, the arithmetic unit 221 is a central processing unit (CPU). The memory 222 stores information required for an arithmetic operation in the arithmetic unit 221. The storage 223 is nonvolatile and stores various data. For example, the storage 223 is a nonvolatile semiconductor memory.

The storage 223 stores a computer program 51. The computer program 51 is read from a recording medium 50 such as an optical disk that stores the computer program 51 by a recording device (not illustrated), written in the storage 223, and stored in the storage 223. The BMU 22 is a computer that causes the computer program 51 to execute processing. The arithmetic unit 221 executes processing required for the BMU 22 according to the computer program 51. Alternatively, some or all of the processing executed by the BMU 22 may be executed by a method other than the method using the computer program 51.

The voltage acquisition unit 224 acquires the voltage across the plurality of energy storage cells 21 connected in series. The voltage acquisition unit 224 measures the voltage or acquires a value of the voltage measured by another method. The voltage acquisition unit 224 may acquire the voltage at each energy storage cell 21. The interface unit 225 is connected to the current sensor 23 and the current cutoff device 24. The interface unit 225 receives a signal related to the current measured by the current sensor 23, and the BMU 22 acquires the value of the current according to the received signal. The BMU 22 outputs a control signal from the interface unit 225 to the current cutoff device 24 to control the current cutoff device 24. The communication unit 226 is connected to the communication connector 27 by the communication line. The communication unit 226 communicates with the outside of the second energy storage apparatus 2 through the communication connector 27. For example, the BMU 22 communicates with the control apparatus 3 through the communication connector 27 using the communication unit 226.

The second energy storage apparatus 2 performs processing for estimating the internal resistance of the plurality of energy storage cells 21. The second energy storage apparatus 2 lowers a state of charge (SOC) of the plurality of energy storage cells 21, and estimates the internal resistance of the plurality of energy storage cells 21 using the current flowing through the plurality of energy storage cells 21 when the charge is performed from the low SOC state. The SOC is a charge rate, and represents a ratio of an electric quantity charged in the energy storage cell 21 to a full charge capacity of the energy storage cell 21.

Figure 4:
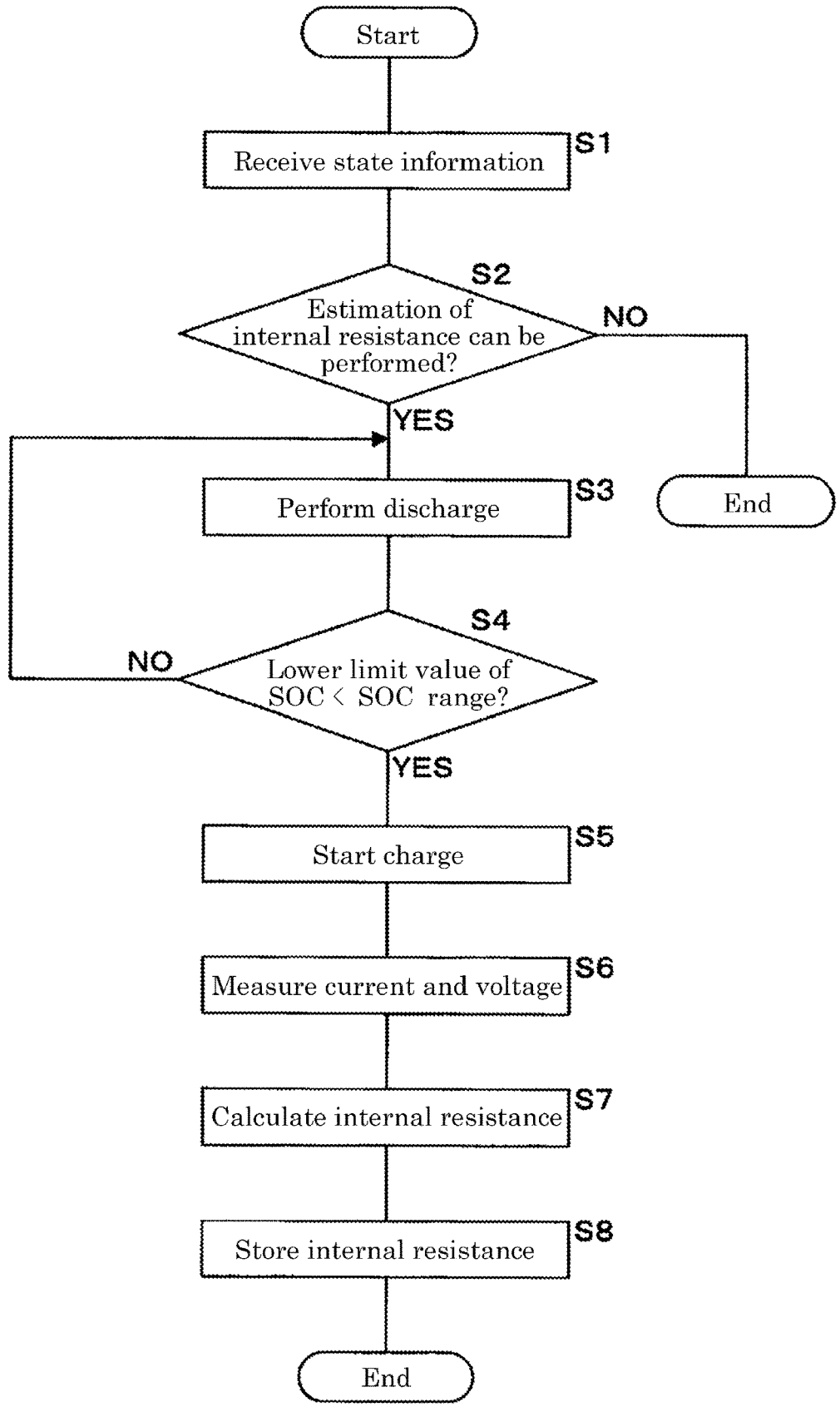
FIG. 4 is a flowchart illustrating a processing procedure of internal resistance estimation processing performed by the second energy storage apparatus.

FIG. 4 is a flowchart illustrating a processing procedure of internal resistance estimation processing performed by the second energy storage apparatus 2. Hereinafter, the step is abbreviated as S. The control apparatus 3 determines the states of the vehicle 4 and the energy storage system 1 as needed, and transmits state information indicating the states of the vehicle 4 and the energy storage system 1. The state information is input to the BMU 22 through the communication connector 27, and the BMU 22 receives the state information using the communication unit 226 (S1).

For example, the control apparatus 3 determines whether the vehicle 4 is parked based on information about the operation of the vehicle 4 such as information about the operation of the engine or the electric motor or speed, and transmits the state information including the information indicating whether the vehicle 4 is parked. For example, the control apparatus 3 determines whether a defect exists in the first energy storage apparatus 11, and transmits the state information including the information indicating whether the defect exists in the first energy storage apparatus 11. The control apparatus 3 determines whether the failure exists in the first energy storage apparatus 11 based on the signal output from the first energy storage apparatus 11 when the first energy storage apparatus 11 has the defect, the voltage applied from the first energy storage apparatus 11 to the first load 12, or the like.

For example, the control apparatus 3 determines whether the first energy storage apparatus 11 is sufficiently charged to supply the power to the second load 14 or the second energy storage apparatus 2, and transmits the state information including the information indicating whether the first energy storage apparatus 11 is sufficiently charged. The control apparatus 3 determines whether the first energy storage apparatus 11 is sufficiently charged by a method for estimating the SOC of the first energy storage apparatus 11 according to an open circuit voltage (OCV) of the first energy storage apparatus 11. In addition, the control apparatus 3 determines whether the defect exists in the DC-DC converter 13 based on the signal or the like output from the DC-DC converter 13 when the DC-DC converter 13 fails, and transmits the state information including the information indicating whether the defect exists in the DC-DC converter 13. The control apparatus 3 transmits the state information periodically or at any time. Alternatively, the BMU 22 may request the state information to the control apparatus 3 periodically or at any time, and the control apparatus 3 may transmit the state information in response to the request.

The arithmetic unit 221 of the BMU 22 determines whether the internal resistance of the plurality of energy storage cells 21 can be estimated based on the received state information (S2). By the processing of S2, the arithmetic unit 221 determines whether to start the processing for lowering the SOC of the plurality of energy storage cells 21. For example, when the state information indicates that the vehicle 4 is not parked, the arithmetic unit 221 determines that the estimation of the internal resistance cannot be performed. When the SOCs of the plurality of energy storage cells 21 are lowered because of a large demand for the power except during the parking, there is a possibility that the power to be supplied becomes insufficient. For example, when the state information indicates that the defect exists in the first energy storage apparatus 11 or that the first energy storage apparatus 11 is not sufficiently charged, the arithmetic unit 221 determines that the estimation of the internal resistance cannot be performed. When the trouble exists in the first energy storage apparatus 11 or when the first energy storage apparatus 11 is not sufficiently charged, there is a possibility that the charge cannot be performed by the power from the first energy storage apparatus 11. In addition, there is a possibility that power cannot be supplied from the first energy storage apparatus 11 to the second load 14 when the power demand is generated in the second load 14 in the state where the SOC of the plurality of energy storage cells 21 are lowered.

For example, when the state information indicates that the defect exists in the DC-DC converter 13, the arithmetic unit 221 determines that the estimation of the internal resistance cannot be performed. When the trouble exists in the DC-DC converter 13, there is a possibility that the power cannot be supplied from the first energy storage apparatus 11 to the second energy storage apparatus 2 or the second load 14 through the DC-DC converter 13. For example, when the vehicle 4 is parked, when the defect does not exist in the first energy storage apparatus 11 and the DC-DC converter 13, and when the first energy storage apparatus 11 is sufficiently charged, the arithmetic unit 221 determines that the estimation of the internal resistance can be performed. In S1, the control apparatus 3 determines whether the estimation of the internal resistance can be performed based on the states of the vehicle 4 and the energy storage system 1, and inputs the determination information indicating the determination result to the BMU 22. In S2, the arithmetic unit 221 may make the determination according to the determination information.

When it is determined that the estimation of the internal resistance cannot be performed (NO in S2), the arithmetic unit 221 ends the processing. When it is determined that the estimation of the internal resistance can be performed (YES IN S2), the BMU 22 discharges the plurality of energy storage cells 21 (S3). For example, the BMU 22 transmits the control signal to the second load 14 to connect the second load 14 to the second energy storage apparatus 2, and supplies the power from the plurality of energy storage cells 21 to the second load 14 to discharge the plurality of energy storage cells 21. The energy storage system 1 may have the load to which the power is supplied from the second energy storage apparatus 2 separately from the second load 14, and the BMU 22 may supply the power from the second energy storage apparatus 2 to the load different from the second load 14. The power is consumed by the load outside the second energy storage apparatus 2, and the plurality of energy storage cells 21 are discharged. Because the load is outside the second energy storage apparatus 2, the configuration is easily performed so as to efficiently consume the power by increasing power consumption or increasing heat dissipation efficiency. By supplying the power to the load that efficiently consumes the power, the power of the plurality of energy storage cells 21 is efficiently consumed, and the discharge of the plurality of energy storage cells 21 is reliably performed. In addition, the time required for discharging the plurality of energy storage cells 21 is shortened.

Figure 5:
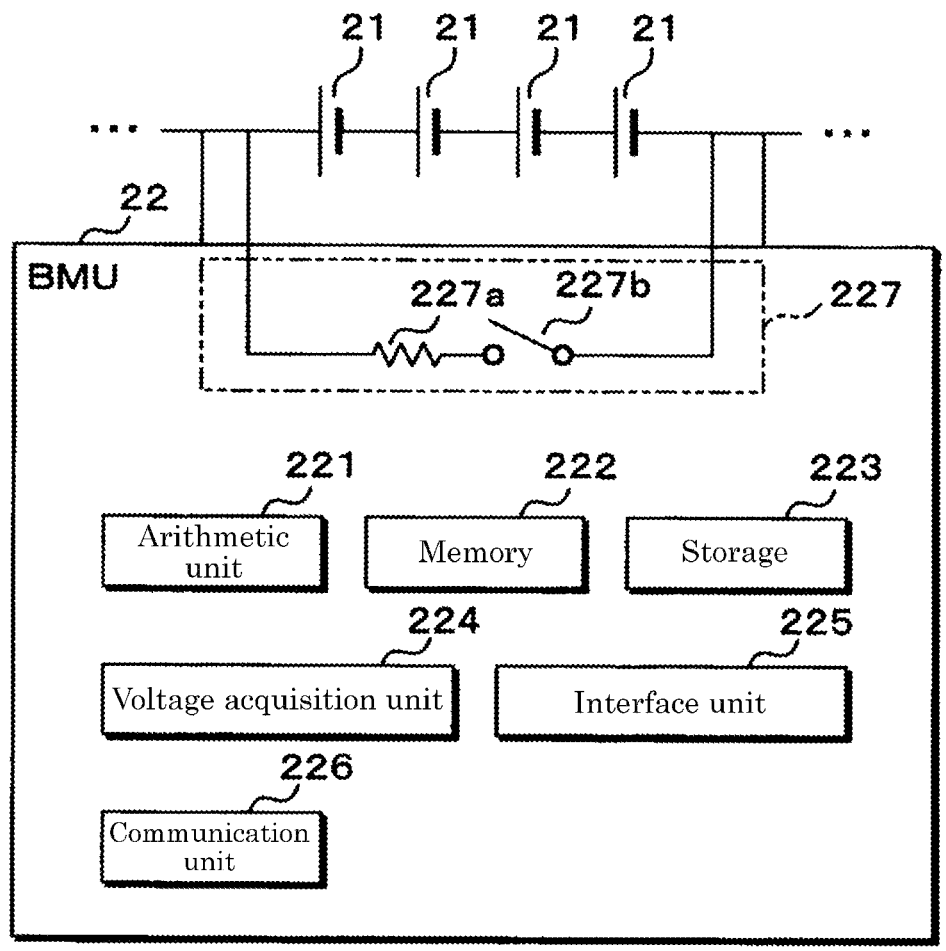
FIG. 5 is a block diagram illustrating a configuration example of the BMU in which current can flow.

The second energy storage apparatus 2 may be configured to discharge the plurality of energy storage cells 21 by causing the current to flow inside the BMU 22. FIG. 5 is a block diagram illustrating a configuration example of the BMU 22 in which the current can flow. The BMU 22 has a load 227a connected to both ends of the plurality of energy storage cells 21 by a power line. A switch 227b is provided on the power line connecting the plurality of energy storage cells 21 and the load 227a. The load 227a and the switch 227b constitute a load circuit 227. When the switch 227b is in the on-state, the current flows from the plurality of energy storage cells 21 to the load 227a. In S3, the arithmetic unit 221 turns on the switch 227b. When the current flows from the plurality of energy storage cells 21 to the load 227a, the power is supplied from the plurality of energy storage cells 21 to the load circuit 227. The power is consumed by the load circuit 227 inside the second energy storage apparatus 2, and the plurality of energy storage cells 21 are discharged. Even when the second energy storage apparatus 2 is not connected to the external load, the second energy storage apparatus 2 can discharge the plurality of energy storage cells 21 by supplying the power to the load circuit 227. In any state of the outside of the second energy storage apparatus 2, the second energy storage apparatus 2 can discharge the plurality of energy storage cells 21 by itself. In addition, because the discharge is performed without flowing the current to the load outside the second energy storage apparatus 2, the second energy storage apparatus 2 can reduce the influence of the discharge on the outside.

Subsequently, the arithmetic unit 221 determines the SOC of the plurality of energy storage cells 21, and determines whether the SOC of the plurality of energy storage cells 21 is less than the lower limit value of the predetermined SOC range (S4). The predetermined SOC range is a range of the SOC of the plurality of energy storage cells 21 used to estimate the internal resistance of the plurality of energy storage cells 21 while the plurality of energy storage cells 21 perform the charge. The upper limit value and the lower limit value of the predetermined SOC range are the upper limit value and the lower limit value of the SOC included in the predetermined SOC range. As described later, the predetermined SOC range is a range in which a change in OCV between both ends of the plurality of energy storage cells 21 with respect to a change in SOC is large. The predetermined SOC range is previously determined. For example, the upper limit value and the lower limit value of the SOC range are previously stored in the storage 223.

For example, the arithmetic unit 221 estimates the SOC of the plurality of energy storage cells 21 by a current integration method, and compares the estimated SOC with the lower limit value of the predetermined SOC range. The arithmetic unit 221 may estimate the SOC of the plurality of energy storage cells 21 using another method other than the current integration method. The arithmetic unit 221 may estimate the SOC of the plurality of energy storage cells 21 using a method other than the current integration method, such as a method based on the relationship between the SOC stored previously in the storage 223 and the voltage during the discharge. The arithmetic unit 221 may determine whether the SOC is less than or equal to the lower limit value of the SOC range. Alternatively, the arithmetic unit 221 compares the acquired voltage with the voltage corresponding to the lower limit value of the SOC range to determine whether the acquired voltage is less than the voltage corresponding to the lower limit value, whereby the arithmetic unit 221 may perform the processing of S4. The arithmetic unit 221 may determine whether the acquired voltage is lower than or equal to the voltage corresponding to the lower limit value. Alternatively, the arithmetic unit 221 may determine whether the SOC is greater than or equal to the lower limit value and less than or equal to the upper limit value of the SOC range. The arithmetic unit 221 compares the acquired voltage with the voltage corresponding to the upper limit value and the lower limit value of the SOC range to determine whether the acquired voltage is greater than or equal to the voltage corresponding to the lower limit value and less than the voltage corresponding to the upper limit value, whereby the arithmetic unit 221 may perform the processing of S4. The arithmetic unit 221 may determine whether the acquired voltage is greater than or equal to the voltage corresponding to the lower limit value and less than or equal to the voltage corresponding to the upper limit value.

When the SOC of the plurality of energy storage cells 21 is greater than or equal to the lower limit value of the predetermined SOC range (NO in S4), the arithmetic unit 221 returns the processing to S3, and the discharge of the plurality of energy storage cells 21 is continued. When the SOC of the plurality of energy storage cells 21 is less than the lower limit value of the predetermined SOC range (YES in S4), the arithmetic unit 221 finishes the discharge and starts the charge of the plurality of energy storage cells 21 (S5). For example, the arithmetic unit 221 causes the communication unit 226 to transmit the control signal starting the charge to the control apparatus 3. The control apparatus 3 receives the control signal to control the first energy storage apparatus 11 and the DC-DC converter 13 according to the control signal, thereby causing the first energy storage apparatus 11 to supply the power to the second energy storage apparatus 2 through the DC-DC converter 13. The BMU 22 charges the plurality of energy storage cells 21 using the power from the first energy storage apparatus 11. The SOC of the plurality of energy storage cells 21 is raised by the charge. At this point, the BMU 22 performs the charge at least until the SOC of the plurality of energy storage cells 21 becomes the value exceeding the lower limit value of the predetermined SOC range. During the charge, the SOC of the plurality of energy storage cells 21 is included in the predetermined SOC range. For this reason, the charge is performed while the SOC of the plurality of energy storage cells 21 is included in the predetermined SOC range. During the charge, the BMU 22 applies the large current to the plurality of energy storage cells 21. For example, an absolute value of the current flowing through the plurality of energy storage cells 21 during the charge is larger than an absolute value of the current flowing during the discharge. By allowing the large current to flow through the plurality of energy storage cells 21, the charge proceeds quickly, and the temporal change of the voltage of the plurality of energy storage cells 21 increases.

Figure 6:
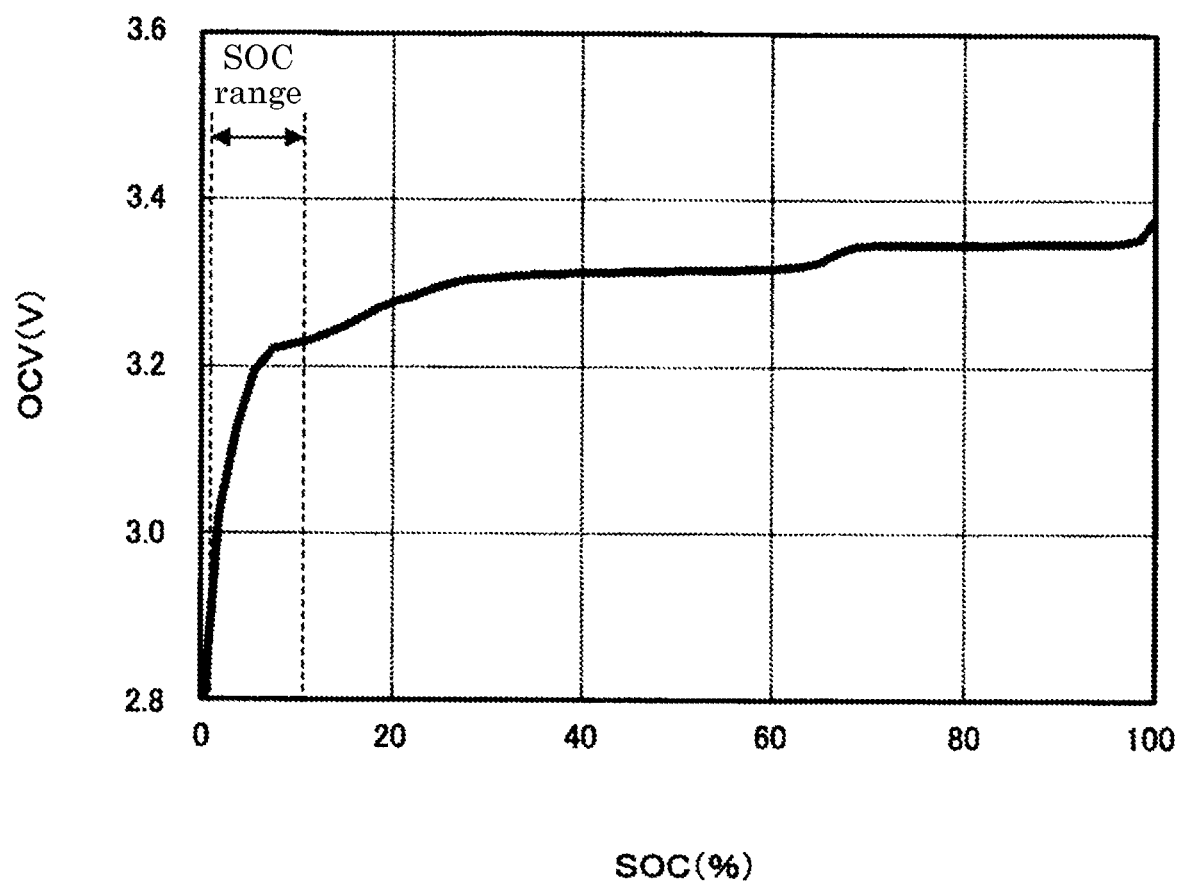
FIG. 6 is a graph illustrating an example of a relationship between an SOC and voltage during charge.

FIG. 6 is a graph illustrating an example of a relationship between the SOC and the OCV. In FIG. 6, a horizontal axis indicates the SOC of the plurality of energy storage cells 21, and a unit is %. A vertical axis indicates the OCV between both ends of the plurality of energy storage cells 21, and the unit is V. FIG. 6 illustrates an example of a predetermined SOC range. The range in which the SOC changes from 0% to 100% includes a range in which the OCV greatly changes with respect to the change in the SOC and a range in which the change in the OCV is small with respect to the change in the SOC. In the range of the SOC in which the OCV greatly changes, the value of the SOC is smaller than that in the range of the SOC in which the change of the OCV is small.

As illustrated in FIG. 6, the predetermined SOC range estimating the internal resistance is a range in which the change in OCV with respect to the change in SOC is larger than the range in which the SOC value is larger. The upper limit value and the lower limit value of the SOC range are previously determined such that the SOC range has the large change in OCV with respect to the change in SOC. For example, the upper limit value is the value of the SOC when an increase rate of the OCV decreases less than or equal to a predetermined value when the SOC is increased from zero. The lower limit is the value greater than zero and less than the upper limit. The lower limit value is desirably the value having a certain degree of magnitude so as not to cause overdischarge when the energy storage cell 21 is discharged. The value of the SOC included in the predetermined SOC range is relatively small. The upper limit value and the lower limit value of the SOC range may be determined such that the SOC range is the range in which the change in the OCV with respect to the change in the SOC is large, and the SOC range in FIG. 6 is an example. For example, the upper limit value may be the value of the SOC of 25%, and the lower limit value may be a value of the SOC of 5%. The voltage generated at both ends of the plurality of energy storage cells 21 during the charge increases or decreases according to the increase or decrease in OCV. When the change in the OCV with respect to the change in the SOC is small, the change in the voltage measured during the charge according to the change in the SOC due to the charge is small. Because the change in the measured voltage is small, the influence of a measurement error on the change in the voltage increases, and the estimation accuracy decreases when the internal resistance is calculated from the measured current value and voltage value. When the change in the OCV with respect to the change in the SOC is large, the change in the voltage measured during the charge according to the change in the SOC due to charge becomes large. The influence of the measurement error on the change in voltage decreases, and the estimation accuracy increases when the internal resistance is calculated from the measured current value and voltage value.

In the middle of the state in which the plurality of energy storage cells 21 are charged while the SOC of the plurality of energy storage cells 21 is included in the predetermined SOC range, the BMU 22 acquires the current measured by the current sensor 23 using the interface unit 225, acquires the voltage by the voltage acquisition unit 224, and measures the current and the voltage (S6). In S6, the BMU 22 measures the current flowing through the plurality of energy storage cells 21 during the charge, and measures the voltage generated at both ends of the plurality of energy storage cells 21 during the charge. The BMU 22 measures the current and the voltage at least once while the SOC is included in the predetermined SOC range. The BMU 22 desirably measures the current and the voltage a plurality of times while the SOC is included in the predetermined SOC range. While the SOC is included in the predetermined SOC range, the change in the voltage according to the change in the SOC is large, so that the current and the voltage can be acquired while the change in the voltage value is large. The BMU 22 stores the measured current and voltage values in the memory 222 or the storage 223. That is, the BMU 22 measures the current and the voltage a plurality of times while the SOC is in the SOC range in the process of raising the SOC. For example, the arithmetic unit 221 estimates the SOC by the current integration method, and stores the values of the current and the voltage in the memory 222 or the storage 223 when the estimated SOC is included in the SOC range. When the plurality of energy storage cells 21 are sufficiently charged, the BMU 22 ends the charge. For example, when the SOC reaches the predetermined value greater than or equal to 80% and less than 100%, the BMU 22 ends the charge.

Subsequently, the arithmetic unit 221 calculates the internal resistances of the plurality of energy storage cells 21 based on the measured current and voltage (S7). In S7, the arithmetic unit 221 calculates the value of the internal resistance based on the plurality of current and voltage values measured while the SOC is in the SOC range. For example, the arithmetic unit 221 estimates the SOC by the current integration method, and calculates the internal resistance by a least squares method using the relationship between the OCV and the voltage and the current generated at both ends of the plurality of energy storage cells 21 based on the OCV corresponding to the SOC, the measured value of the voltage, and the measured value of the current. The BMU 22 estimates the internal resistance of the plurality of energy storage cells 21 by the calculation in S7. In S7, the arithmetic unit 221 may calculate the internal resistance using not only the values of the current and the voltage measured while the SOC is in the SOC range but also the current or the voltage measured before the start of the charge or the voltage estimated from the SOC. The arithmetic unit 221 may calculate the internal resistance using the values of the current and the voltage measured once while the SOC is in the SOC range and the current or the voltage measured before the start of the charge or the voltage estimated from the SOC.

The arithmetic unit 221 stores the calculated value of the internal resistance in the storage 223 (S8), and ends the internal resistance estimation processing. In S8, the arithmetic unit 221 may update the value of the internal resistance stored in the storage 223. The BMU 22 executes the pieces of processing of S1 to S8 as needed. The value of the internal resistance stored in the storage 223 can be used to estimate the full charge capacity of the plurality of energy storage cells 21 or determine the degradation state of the plurality of energy storage cells 21.

Figure 7:
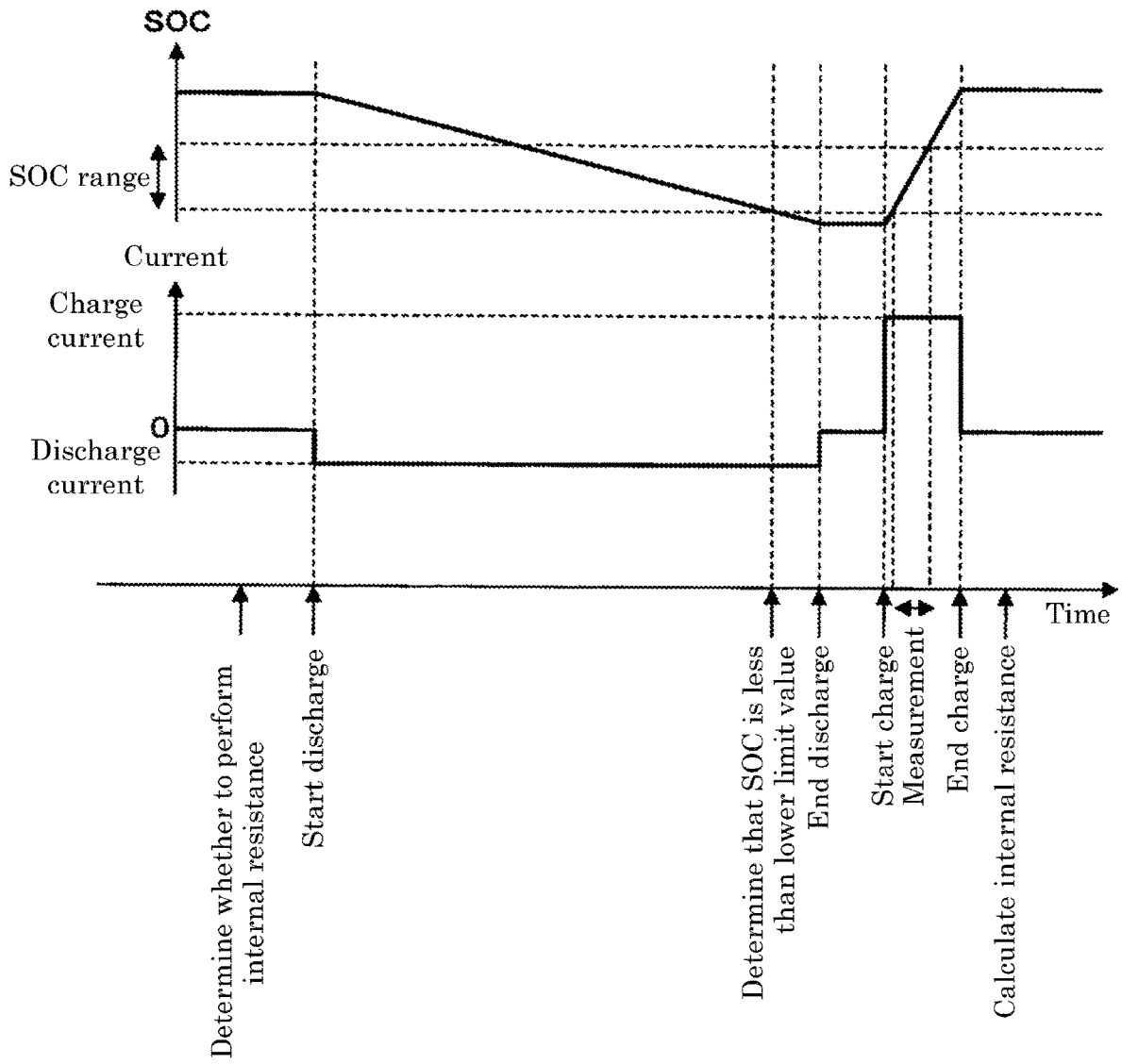
FIG. 7 is a timing chart illustrating timing of each processing performed by the second energy storage apparatus.

FIG. 7 is a timing chart illustrating timing of each processing performed by the second energy storage apparatus 2. The horizontal axis represents an elapsed time. FIG. 7 illustrates temporal changes in SOC and current of the plurality of energy storage cells 21. Among the currents flowing through the plurality of energy storage cells 21, the charge current is indicated by a positive value, and the discharge current is indicated by a negative value. Initially, the value of the current is zero. The BMU 22 determines whether to perform the internal resistance estimation, and starts the discharge. During the discharge, the discharge current flows through the plurality of energy storage cells 21, and the SOC is lowered. The BMU 22 ends the discharge after determining that the SOC is less than the lower limit value of the SOC range. The lowering of the SOC stops and the current becomes zero. Subsequently, the BMU 22 starts the charge. During the charge, the charge current flows through the plurality of energy storage cells 21, and the SOC is raised. The absolute value of the charge current is larger than the absolute value of the discharge current. In the process of raising the SOC, while the SOC is raised within the SOC range, the BMU 22 measures the current and the voltage the plurality of times. When the plurality of energy storage cells 21 are sufficiently charged, the BMU 22 terminates the charge and calculates and stores the internal resistances of the plurality of energy storage cells 21.

As described above in detail, the second energy storage apparatus 2 measures the current and the voltage in the process of lowering the SOC of the plurality of energy storage cells 21 by performing the discharge and then raising the SOC of the plurality of energy storage cells 21 by performing the charge. The second energy storage apparatus 2 estimates the internal resistance by calculating the internal resistance of the plurality of energy storage cells 21 based on the current and the voltage measured while the SOC is raised within the predetermined SOC range during the charge. The change in voltage with respect to the change in SOC is large within the predetermined SOC range. For this reason, the accuracy of estimating the internal resistance becomes high when the change in the value of the voltage measured during the charge is large and when the internal resistance is calculated using the measured current and voltage. Because the internal resistance is calculated after the SOC is adjusted such that the change in the voltage value becomes large, the accuracy of estimating the internal resistance is always high, and the internal resistance can be stably estimated with high accuracy.

In addition, because the second energy storage apparatus 2 performs the charge after lowering the SOC of the plurality of energy storage cells 21, there is a low possibility that the overcharge is generated in the plurality of energy storage cells 21 even when the large current flows during the charge. When the large current is simply passed through the energy storage device, although there is a possibility that the overcharge or the overdischarge is generated, but when the large current is passed for the charge while the SOC of the energy storage device is lowered, the possibility of the overcharge or the overdischarge is low. For this reason, the large current can flow even in the second energy storage apparatus 2 in which the large current does not flow during the cranking. When the large current is allowed to flow through the plurality of energy storage cells 21, the charge proceeds quickly, and the temporal change of the measured voltage increases. The change in the value of the voltage measured during the charge further increases, and the accuracy of estimating the internal resistance is further improved when the internal resistance is calculated from the measured current value and voltage value. As described above, the second energy storage apparatus 2 can estimate the internal resistance of the plurality of energy storage cells 21 with high accuracy even when there is no opportunity that the large current flows due to the discharge.

In the embodiment, when the plurality of energy storage cells 21 connected in series are integrated into one energy storage device, the internal resistance of the energy storage device is estimated. Alternatively, the second energy storage apparatus 2 may estimate the internal resistance of each energy storage cell 21. The energy storage device may include the energy storage cells 21 connected in parallel.

The present invention is not limited to the contents of the above embodiment, but various modifications can be made within the scope of the claims. That is, an embodiment obtained by combining technical means appropriately changed within the scope of the claims is also included in the technical scope of the present invention.

DESCRIPTION OF REFERENCE SIGNS

1: energy storage system
11: first energy storage apparatus
12: first load
13: DC-DC converter (power transmission circuit)
14: second load
2: second energy storage apparatus
21: energy storage cell (energy storage device)
22: BMU (management unit)
227: load circuit
227a: load
227b: switch 3: control apparatus
4: vehicle
50: recording media
51: computer program

The invention claimed is:

1. An energy storage system comprising:
a first energy storage apparatus;
a second energy storage apparatus that supplies power to a second load different from a first load to which the first energy storage apparatus supplies power;
a power transmission circuit that supplies power from the first energy storage apparatus to the second energy storage apparatus; and
a DC-DC converter,
wherein
the second energy storage apparatus includes an energy storage device and a management unit,
the management unit:
lowers an SOC of the energy storage device by discharge of the energy storage device, and
acquires current and voltage of the energy storage device while the SOC of the energy storage device is within a predetermined SOC range in a process of supplying power from the first energy storage apparatus to the second energy storage apparatus through the power transmission circuit to raise the SOC of the energy storage device by charge of the energy storage device, and calculates an internal resistance of the energy storage device based on the acquired current and voltage, and
determines that estimation of the internal resistance is not performed when a defect exists in the DC-DC converter, and
the SOC range is a range in which a change in voltage of the energy storage device with respect to a change in SOC of the energy storage device is larger than a range in which a value of the SOC is larger than the SOC range.

2. The energy storage system according to claim 1, further comprising a control apparatus, wherein
the second load is connected to the second energy storage apparatus,
the first energy storage apparatus is connected to the second load or the second energy storage apparatus through the power transmission circuit,
the control apparatus inputs state information indicating whether a state of the first energy storage apparatus and/or the power transmission circuit is a state in which power can be supplied from the first energy storage apparatus to the second load or the second energy storage apparatus to the management unit, and
the management unit determines whether to start processing for lowering an SOC of the energy storage device according to the state information.

3. The energy storage system according to claim 2, wherein
the energy storage system is provided in a vehicle, and
the control apparatus inputs information indicating whether the vehicle is parked to the management unit as the state information.

4. The energy storage system according to claim 1, wherein
the energy storage system is provided in a vehicle,
the first load includes electric equipment used to drive or start the vehicle,
the second load does not include any electric equipment used to drive or start the vehicle, and
the second energy storage apparatus does not supply power to the first load.

5. The energy storage system according to claim 1, wherein the second energy storage apparatus is included in an electric vehicle, and supplies the power to a 12-V load of the electric vehicle.

6. A method for estimating an internal resistance of an energy storage device, the method comprising:
lowering an SOC of the energy storage device by discharge of the energy storage device;
acquiring current and voltage of the energy storage device while the SOC of the energy storage device is within a predetermined SOC range in a process of supplying power from a first energy storage apparatus to a second energy storage apparatus through a power transmission circuit to raise the SOC of the energy storage device by charge of the energy storage device;
calculating the internal resistance of the energy storage device based on the acquired current and voltage; and
determining that estimation of the internal resistance is not performed when a defect exists in a DC-DC converter,
wherein
the SOC range is a range in which a change in voltage of the energy storage device with respect to a change in SOC of the energy storage device is larger than a range in which a value of SOC is larger than the SOC range.

7. A non-transitory computer readable storage medium storing a computer program causing a computer to execute processing for estimating an internal resistance of an energy storage device, the computer program causing the computer to execute:
lowering an SOC of the energy storage device by discharge of the energy storage device;
acquiring current and voltage of the energy storage device while the SOC of the energy storage device is included in a predetermined SOC range in which a change in voltage of the energy storage device with respect to a change in the SOC of the energy storage device is larger than other ranges in a process of supplying power from a first energy storage apparatus to a second energy storage apparatus through a power transmission circuit to raise the SOC of the energy storage device by charge of the energy storage device;
calculating the internal resistance of the energy storage device based on the acquired current and voltage; and
determining that estimation of the internal resistance is not performed when a defect exists in a DC-DC converter.

* * * * *